(12) United States Patent
Taniguchi

(10) Patent No.: US 9,273,914 B2
(45) Date of Patent: Mar. 1, 2016

(54) ELECTRONIC COMPONENT MOUNTING PACKAGE AND ELECTRONIC APPARATUS USING THE SAME

(75) Inventor: Masahiko Taniguchi, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 374 days.

(21) Appl. No.: 13/990,027

(22) PCT Filed: Nov. 29, 2011

(86) PCT No.: PCT/JP2011/077549
§ 371 (c)(1),
(2), (4) Date: May 28, 2013

(87) PCT Pub. No.: WO2012/073963
PCT Pub. Date: Jun. 7, 2012

(65) Prior Publication Data
US 2013/0250520 A1  Sep. 26, 2013

(30) Foreign Application Priority Data
Nov. 29, 2010 (JP) .................. 2010-265358

(51) Int. Cl.
*H05K 7/20* (2006.01)
*F28F 21/08* (2006.01)
(Continued)

(52) U.S. Cl.
CPC ............ *F28F 21/089* (2013.01); *H01L 23/045* (2013.01); *H01L 31/0203* (2013.01);
(Continued)

(58) Field of Classification Search
CPC .................. H05K 7/2039; H05K 2201/10106; H05K 7/205; H05K 1/0271; H05K 2201/068
USPC .......................... 361/707, 708, 712, 717, 718
See application file for complete search history.

(56) References Cited

U.S. PATENT DOCUMENTS

2004/0041222 A1* 3/2004 Loh ............................... 257/433
2005/0169328 A1* 8/2005 Freeman et al. ................ 372/36
(Continued)

FOREIGN PATENT DOCUMENTS

JP   H08-130266 A   5/1996
JP   2001-135745 A   5/2001
(Continued)

OTHER PUBLICATIONS

International Search Report dated Dec. 27, 2011, issued for International Application No. PCT/JP2011/077549.

*Primary Examiner* — Adam B Dravininkas
(74) *Attorney, Agent, or Firm* — Procopio, Cory, Hargreaves & Savitch LLP

(57) ABSTRACT

An electronic component mounting package includes a first base including an upper surface and a first through-hole vertically formed; a second base having a second through-hole arranged to be overlapped with the first through-hole in a plan view; a sealing material filling the second through-hole; and a signal terminal that is fixed to the second base to pass through the sealing material and has an upper end portion that protrudes upwardly from the upper surface of the first base. The first base includes a plurality of first metal members and a second metal member, and the second metal member is vertically interposed between the plurality of first metal members. A thermal expansion coefficient of the first metal members is larger than a thermal expansion coefficient of the second base. A thermal conductivity of the second metal member is higher than a thermal conductivity of the first metal members.

10 Claims, 11 Drawing Sheets

(51) Int. Cl.
  *H01L 23/045* (2006.01)
  *H01L 31/0203* (2014.01)
  *H01L 31/024* (2014.01)
  *H01S 5/022* (2006.01)
  *H01S 5/024* (2006.01)
  *H01L 23/36* (2006.01)
  *H01S 5/00* (2006.01)
  *H01S 5/068* (2006.01)
  *H01S 5/0683* (2006.01)

(52) U.S. Cl.
  CPC ............ *H01L31/024* (2013.01); *H05K 7/2039* (2013.01); *H01L 23/36* (2013.01); *H01L 2224/4823* (2013.01); *H01L 2224/48091* (2013.01); *H01L 2224/48227* (2013.01); *H01L 2924/19107* (2013.01); *H01L 2924/3011* (2013.01); *H01S 5/0071* (2013.01); *H01S 5/02212* (2013.01); *H01S 5/02415* (2013.01); *H01S 5/02469* (2013.01); *H01S 5/0683* (2013.01); *H01S 5/06804* (2013.01)

(56) References Cited

U.S. PATENT DOCUMENTS

| | | | |
|---|---|---|---|
| 2006/0186423 A1* | 8/2006 | Blonder et al. | 257/98 |
| 2010/0072511 A1* | 3/2010 | Lin et al. | 257/99 |
| 2010/0240158 A1* | 9/2010 | Ter-Hovhannissian | 438/27 |
| 2011/0085304 A1* | 4/2011 | Bindrup et al. | 361/718 |
| 2011/0249406 A1* | 10/2011 | Andrews | 361/704 |

FOREIGN PATENT DOCUMENTS

| | | |
|---|---|---|
| JP | 2010-010658 A | 1/2010 |
| JP | 2011-009574 A | 1/2011 |
| JP | 2011-049523 A | 3/2011 |

* cited by examiner (a)

(b)

(a)

(b)

(a)

(b)

ELECTRONIC COMPONENT MOUNTING PACKAGE AND ELECTRONIC APPARATUS USING THE SAME

TECHNICAL FIELD

The present invention relates to an electronic component mounting package for mounting and accommodating an electronic component such as an optical semiconductor device used in an optical communication field or the like, and an electronic apparatus using the same.

BACKGROUND ART

An electronic component mounting package used in an electronic apparatus in the related art includes a base having an electronic component mounting section on an upper surface thereof, and a signal terminal provided in the base. For example, the base has a through-hole, and a sealing material fills the through-hole. The signal terminal passes through the sealing material to be fixed to the base. An electronic component is mounted on the upper surface of the base, and is covered by a cover, for example.

CITATION LIST

Patent Literature

Patent Literature 1: Japanese Unexamined Patent Publication JP-A-8-130266 (1996)

SUMMARY OF INVENTION

Technical Problem

However, in order to sufficiently radiate heat generated from an electronic component such as an optical semiconductor device driven with a large output, a heat radiating member made of copper, for example, having a high thermal conductivity may be arranged between a base and an electronic component, but a thermal expansion coefficient difference between the electronic component and the heat radiating member may be large, or a bonding strength between the electronic component and the heat radiating member may be insufficient, and thus, electronic component mounting reliability may deteriorate.

In order to solve the above problems, an object of the invention is to provide an electronic component mounting package capable of effectively radiating heat generated from an electronic component, and an electronic apparatus using the same.

Solution to Problem

According to an aspect of the invention, an electronic component mounting package includes a first base, a second base, a sealing material, and a signal terminal. The first base includes an upper surface, a lower surface opposed to the upper surface and a first through-hole that is vertically formed. The first base includes a plurality of first metal members and a second metal member. The second metal member is vertically interposed between the plurality of first metal members. The second base is bonded to the lower surface, and is arranged to be overlapped with the first through-hole vertically formed. The sealing material fills a second through-hole. The signal terminal is fixed to the second base to pass through the sealing material, and passes through the first through-hole. The signal terminal has an upper end portion that protrudes upwardly from the upper surface of the first base. The thermal expansion coefficient of the first metal members is larger than the thermal expansion coefficient of the second base. The thermal conductivity of the second metal member is higher than the thermal conductivity of the first metal members.

According to another aspect of the invention, an electronic apparatus includes the above-described electronic component mounting package, an electronic component mounted on the electronic component mounting package, and a cover that is bonded to an upper surface of the first base.

Advantageous Effects of Invention

In the electronic component mounting package according to the aspect of the invention, since the thermal expansion coefficient of the first metal member is larger than the thermal expansion coefficient of the second base, it is possible to alleviate a thermal expansion difference between the second base and an electronic component having a thermal expansion coefficient larger than that of the second base by the first metal member. Thus, it is possible to enhance a bonding strength between the electronic component and the electronic component mounting package, and to enhance mounting reliability of the electronic component. Further, since the thermal conductivity of the second metal member is higher than the thermal conductivity of the first metal member, it is possible to efficiently radiate heat generated from the electronic component through the second metal member, to stably drive the electronic component such as a large output optical semiconductor device.

DESCRIPTION OF EMBODIMENTS

Exemplary embodiments of the invention will be described with reference to the accompanying drawings.

Figure 1:
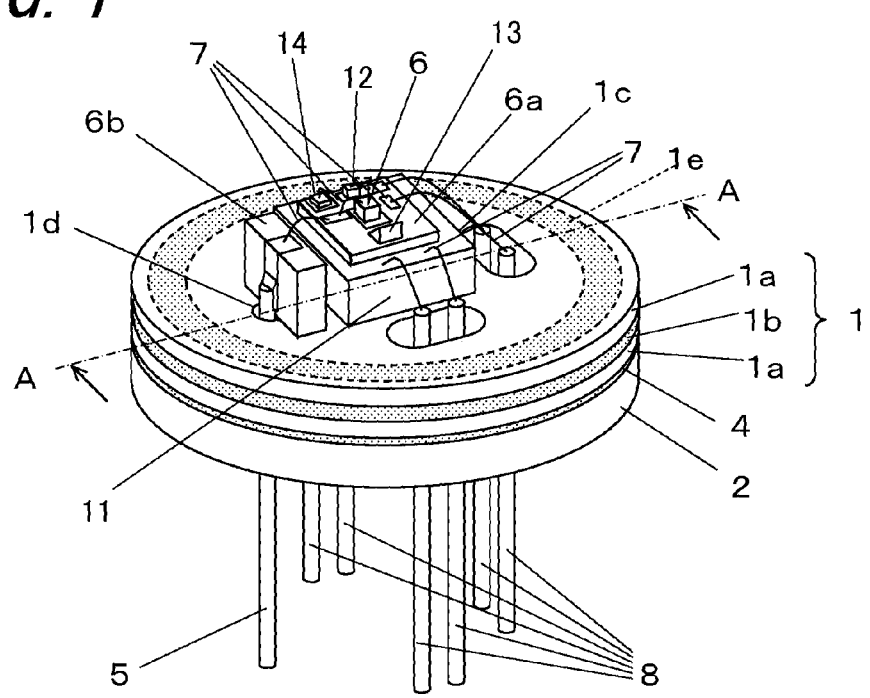
FIG. 1 is a perspective view illustrating an example of an electronic apparatus according to an embodiment of the invention.
Figure 1:
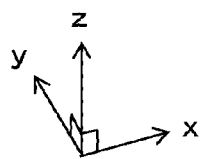
Figure 2:
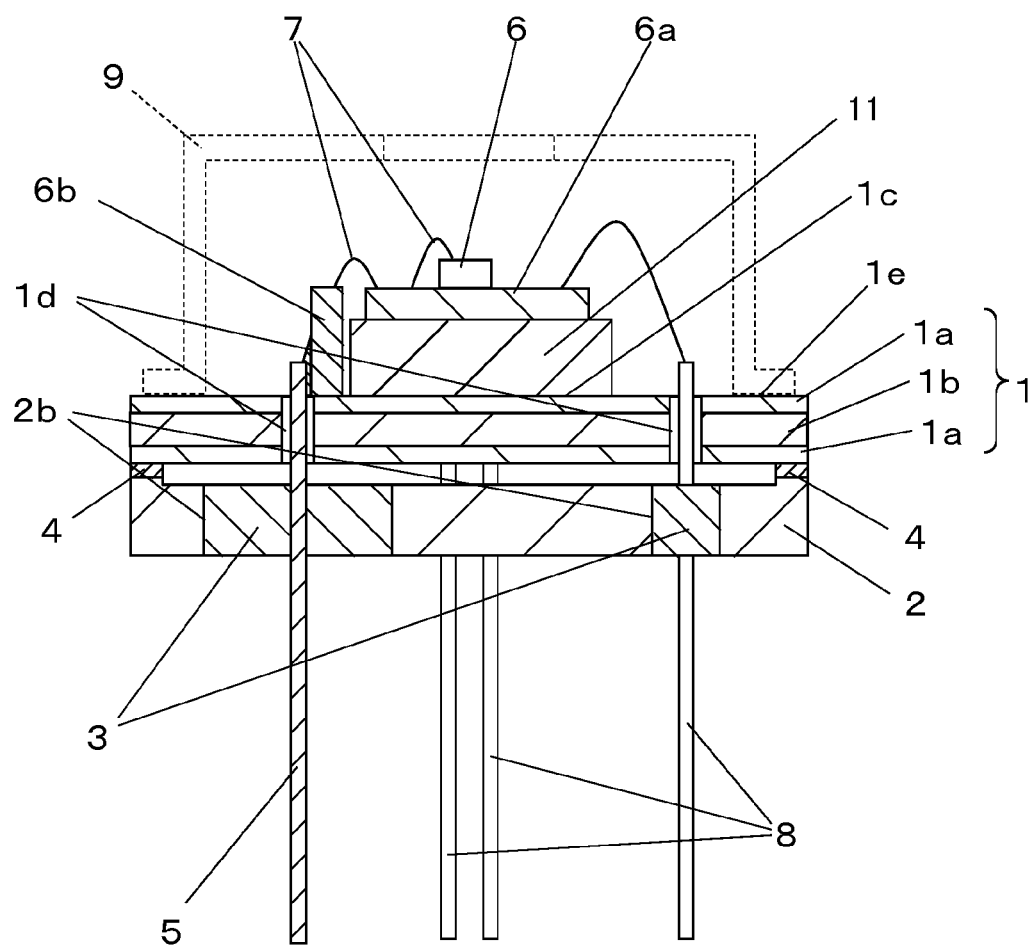
FIG. 2 is a cross-sectional view illustrating a cross-section taken along the line A-A of the electronic apparatus shown in FIG. 1.
Figure 3:
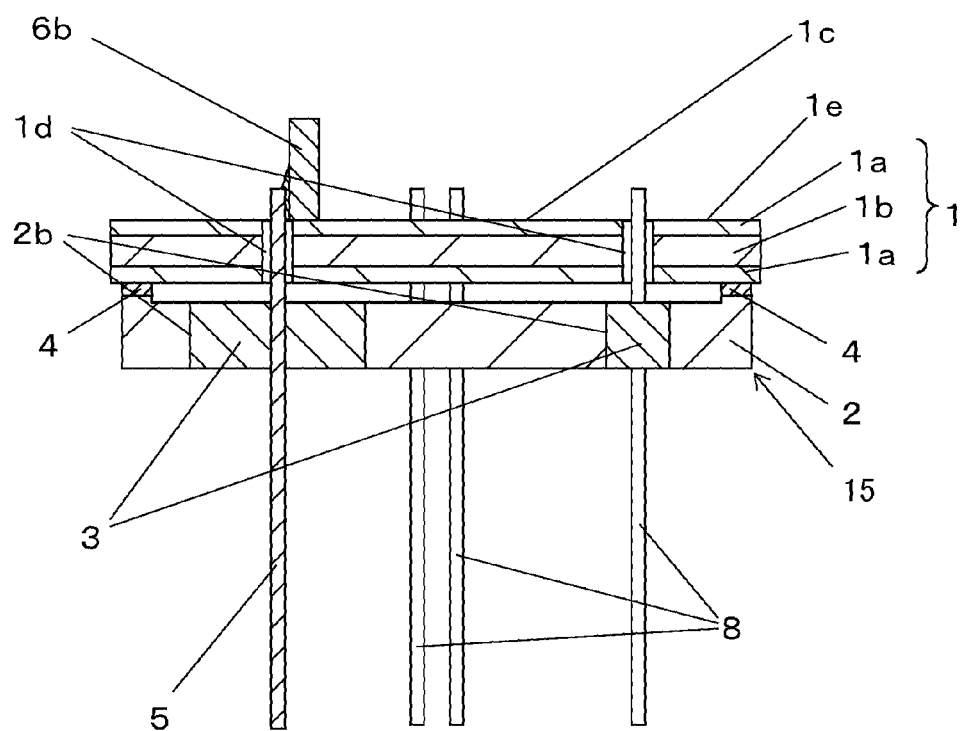
FIG. 3 is a cross-sectional view illustrating an example of an electronic component mounting package according to an embodiment of the invention.

As shown in FIGS. 1 and 2, an electronic apparatus according to an embodiment of the invention includes an electronic component mounting package 15, an electronic component 6 mounted on the electronic component mounting package 15, a circuit board 6a, a temperature control element 11, a PD element 12, a reflecting mirror 13, a temperature monitor element 14, and a cover 9 bonded to an upper surface of a first base 1. In FIG. 1, the electronic apparatus is provided in an imaginary space xyz. Hereinafter, an "upper direction" represents a positive direction of an imaginary z axis, for ease of description.

The electronic component mounting package 15 includes the first base 1, a second base 2 bonded to a lower surface of the first base 1, a signal terminal 5 fixed to the second base 2 to pass through the first base 1 and the second base 2, a relay board 6b, and a DC terminal 8. The first base 1 includes an upper surface, the lower surface opposed to the upper surface and a first through-hole 1d formed in a vertical direction. The first base 1 includes a plurality of first metal members 1a and a second metal member 1b. A thermal expansion coefficient of the first metal member 1a is larger than a thermal expansion coefficient of the second base 2. The second metal member 1b is vertically interposed between the plurality of first metal members 1a. The thermal conductivity of the second metal member 1b is higher than the thermal conductivity of the first metal members 1a. The second base 2 is bonded to the lower surface of the first base 1, and is arranged to be overlapped with the first through-hole 1d vertically formed. The signal terminal 5 is fixed to the second base 2 to pass through a sealing material 3 that fills a second through-hole 2b, and passes through the first through-hole 1d. The signal terminal 5 includes an upper end portion that protrudes upwardly from the upper surface of the first base 1.

In the example shown in FIG. 1, the electronic component 6 is mounted through the temperature control element 11 such as a Peltier element and the circuit board 6a, using a central portion of the upper surface of the first base 1 as a mounting section 1c. A terminal of the electronic component 6 is electrically connected to a wiring on the circuit board 6a by a bonding wire 7. The relay board 6b relays electric connection of the circuit board 6a and the signal terminal 5. The upper end portion of the signal terminal 5 on the side of the first base 1 and a signal line of the relay board 6b are electrically connected to each other by a bonding material such as a brazing material, and the signal line on an upper surface of the relay board 6b and the wiring of the circuit board 6a are electrically connected to each other by the bonding wire 7, and thus, the electronic component 6 and the signal terminal 5 are electrically connected to each other. In the second base 2, three second through-holes 2b are formed in addition to the second through-hole 2b for fixing the signal terminal 5. The DC terminal 8 is a terminal that functions as a ground. Two DC terminals 8 are fixed into each of three second through-holes 2b by the sealing member 3. An end portion of the DC terminal 8 protrudes out of the corresponding first through-hole 1d formed in the first base. Further, the terminal of the electronic component 6 is electrically connected to one DC terminal 8 through the wiring of the circuit board 6a. Accordingly, the signal terminal 5 functions as a transmission path that transmits an input/output signal between the electronic component 6 and an external electric circuit (not shown).

In the example shown in FIG. 1, the main electronic component 6 is an LD element as an example, the PD element 12 monitors an oscillation state of the LD element, the reflecting mirror 13 vertically reflects laser light, which is oscillated from the LD element, from the upper surface of the circuit board 6a (the first base 1), and the temperature monitor element 14 measures the temperature of the circuit board 6a to feedback the result to the temperature control element 11. The PD element 12, the reflecting mirror 13 and the temperature monitor element 14 are mounted on the circuit board 6a. Further, the DC terminals 8 are used for the above-mentioned ground, and are further used for power supply to the temperature control element 11, the PD element 12 and the temperature monitor element 14.

In the example shown in FIG. 1, a state where the cover 9 is detached to show a mounting state of the electronic component 6 or the like is shown, but as in the example shown in FIG. 2, the electronic apparatus according to the embodiment of the invention is basically formed by bonding the cover 9 indicated as a broken line to a cover bonding section 1e by welding or brazing. In the cover 9 of the example shown in FIG. 2, an example is shown in which a window portion is provided in which a light-transmitting member is fit in order to transmit the laser light vertically reflected from the upper surface of the first base 1 by the reflecting mirror 13.

In the example shown in FIGS. 1 and 2, one electronic component 6 is mounted on the mounting section 1c of the first base 1 through the circuit board 6a and the temperature control element 11, but a plurality of electronic components 6 may be mounted. Further, the electronic component 6 may be directly mounted on the mounting section 1c of the first base 1, without passing through the circuit board 6a and the temperature control element 11, and the electronic component 6 and the signal terminal 5 may be directly connected to each other by the bonding wire 7. Further, the signal terminal 5 may be plural according to the number of the electronic components 6 and the number of electrodes of the electronic components 6. Further, the number of the DC terminals 8 is determined according to the number of the temperature control element 11, the PD element 12, the temperature monitor element 14 and the like. By connecting the signal terminal 5 with the electronic component 6 through the relay board 6b by the bonding wire 7, it is possible to reduce the length of the bonding wire 7, and thus, it is possible to favorably suppress impedance errors, which is preferable.

The electronic component mounting package 15 according to the embodiment of the invention includes the first base 1 that has the upper surface including the mounting section on which the electronic component 6 is mounted and the first through-holes 1d that are vertically formed; the second base 2 that is bonded to the periphery of the lower surface of the first base 1 and has the second through-holes 2b that are vertically formed and are arranged to be overlapped with the first through-holes 1d in a plan view; the sealing material 3 fills the second through-holes 2b; and the signal terminal 5 that is fixed to the second base 2 to pass through the sealing material 3, passes through the first through-hole 1d and has the upper end portion that protrudes upwardly from the upper surface of the first base 1. The first base 1 includes the plurality of first metal members 1a and the second metal member 1b, and the second metal member 1b is vertically interposed between the plurality of first metal members 1a. The thermal expansion coefficient of the first metal members 1a is larger than the thermal expansion coefficient of the second base 2, and the thermal conductivity of the second metal member 1b is higher than the thermal conductivity of the first metal members 1a.

In the electronic component mounting package 15, according to such a configuration, since the thermal expansion coefficient of the first metal members 1a is larger than the thermal expansion coefficient of the second base 2, and the thermal conductivity of the second metal member 1b is higher than the thermal conductivity of the first metal members 1a, it is possible to alleviate the thermal expansion difference between the second base 2 and the electronic component 6 having a thermal expansion coefficient larger than that of the second base 2 by the first metal members 1a, and a bonding strength between the electronic component 6 and the electronic component mounting package 15 becomes strong. Further, it is possible to enhance mounting reliability of the electronic component 6, and to obtain the electronic component mounting package 15 capable of efficiently radiating heat generated from the electronic component 6 to the outside through the second metal member 1b. Further, since the signal terminal 5 is adjusted to have a predetermined impedance and is fixed by the sealing material 3 which fills the through-hole 2b of the second base 2, it is possible to form the through-hole 1b of the first base 1 through which the signal terminal 5 passes to have a small diameter for adjustment of impedance as an air coaxial structure in cooperation with the signal terminal 5, and thus, it is possible to increase the area of the mounting section 1c on which the electronic component 6 is mounted.

Further, in the electronic component mounting package 15 according to the embodiment of the invention, in the above-described configuration, since the thermal conductivity of the first metal members 1a is higher than the thermal conductivity of the second base 2, it is possible to efficiently conduct the heat generated from the electronic component 6 to the second metal member 1b. Further, since the thermal conductivity of the second metal material 1b is high, the electronic component mounting package 15 capable of efficiently radiating the heat from a side surface of the first base 1 to the outside is achieved.

Further, in the electronic component mounting package 15 according to the embodiment of the invention, in the above-described configuration, an edge portion of the second metal member 1b is exposed, that is, extended from the first metal members on the side surface of the first base 1. Thus, the electronic component mounting package 15 capable of efficiently radiating the heat transferred to the second metal member 1b from the side surface of the first base 1 to the outside is achieved.

Further, as in the examples shown in FIGS. 3 to 7, in the above-described configuration, when the outer size of the first base 1 is larger than the outer size of the second base 2, for example, a radiator such as a casing that accommodates the electronic apparatus is easily attached to the side surface of the first base 1. Thus, the electronic component mounting package 15, that easily radiates the heat generated from the electronic component 6 to the outside through the first base 1, is achieved.

Figure 6:
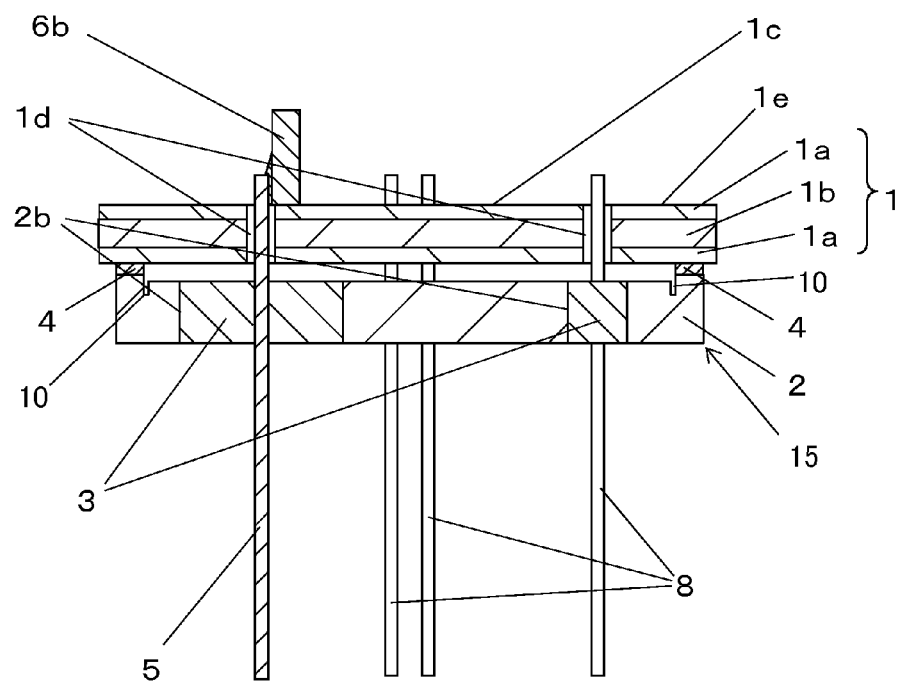
FIG. 6 is a cross-sectional view illustrating another example of the electronic component mounting package according to the embodiment of the invention.
Figure 7:
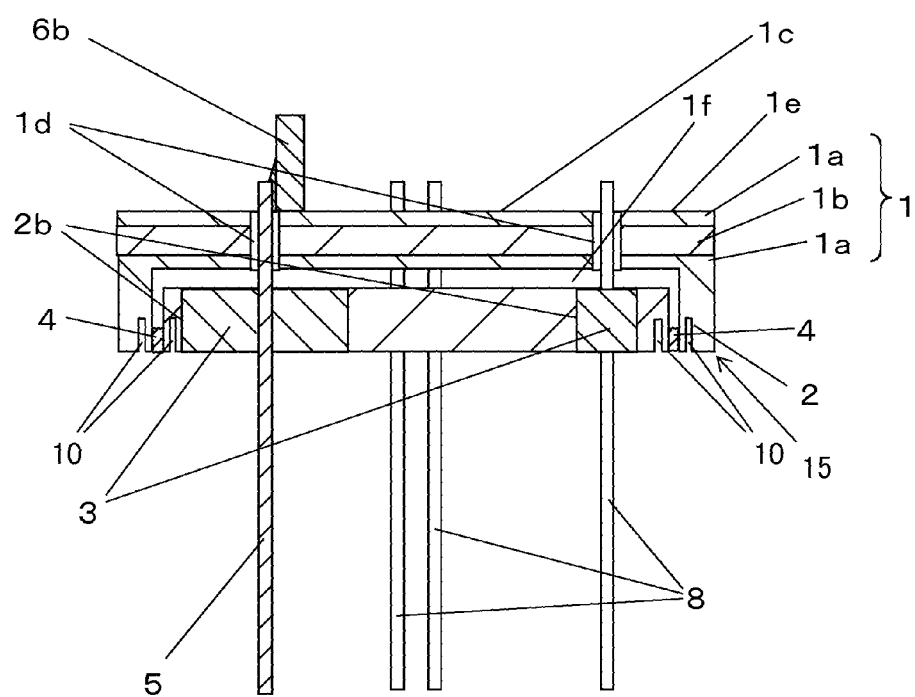
FIG. 7 is a cross-sectional view illustrating another example of the electronic component mounting package according to the embodiment of the invention.
Figure 8:
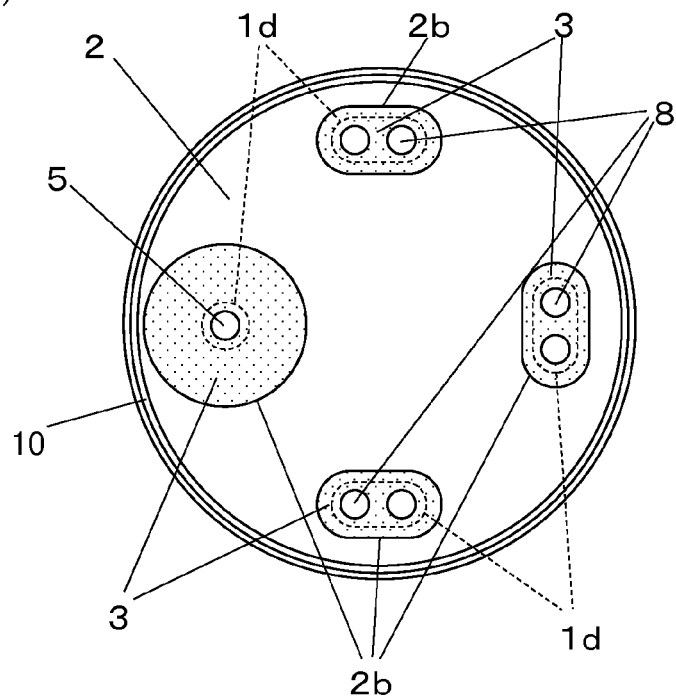
FIG. 8(a) is a bottom view illustrating an example of a second base of the electronic component mounting package of the invention shown in FIG. 7.
FIG. 8(b) is a bottom view illustrating another example of the second base.
Figure 8:
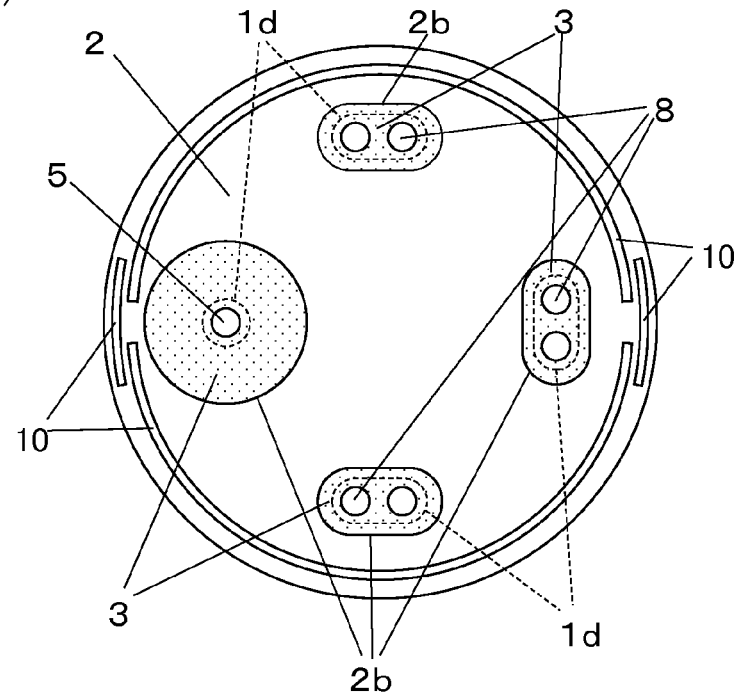

Further, as in the examples shown in FIGS. 6 to 8, in the above configuration, when at least one of the first base 1 and the second base 2 has a groove 10 along a bonding section of the first base 1 and the second base 2, even though heat is generated from the mounted electronic component 6 to generate thermal stress due to the difference of the thermal expansion coefficients between the first base 1 and the second base 2, the thermal stress is alleviated by the groove 10 and the thermal stress applied to the bonding section of the first base 1 and the second base 2 is small. Thus, the electronic component mounting package 15 capable of obtaining an electronic apparatus with high reliability in airtight reliability is achieved.

Further, as in the example shown in FIG. 7, in the above configuration, when the first base 1 has a concave portion 1f on the lower surface thereof and the second base 2 is bonded to the first base 1 inside the concave portion 1f, it is possible to easily increase the area of the side surface of the first base 1 without changing the thickness of the package, and thus, it is possible to efficiently radiate the heat through the side surface of the first base 1. Thus, the electronic component mounting package 15 with higher heat radiation is achieved.

Figure 9:
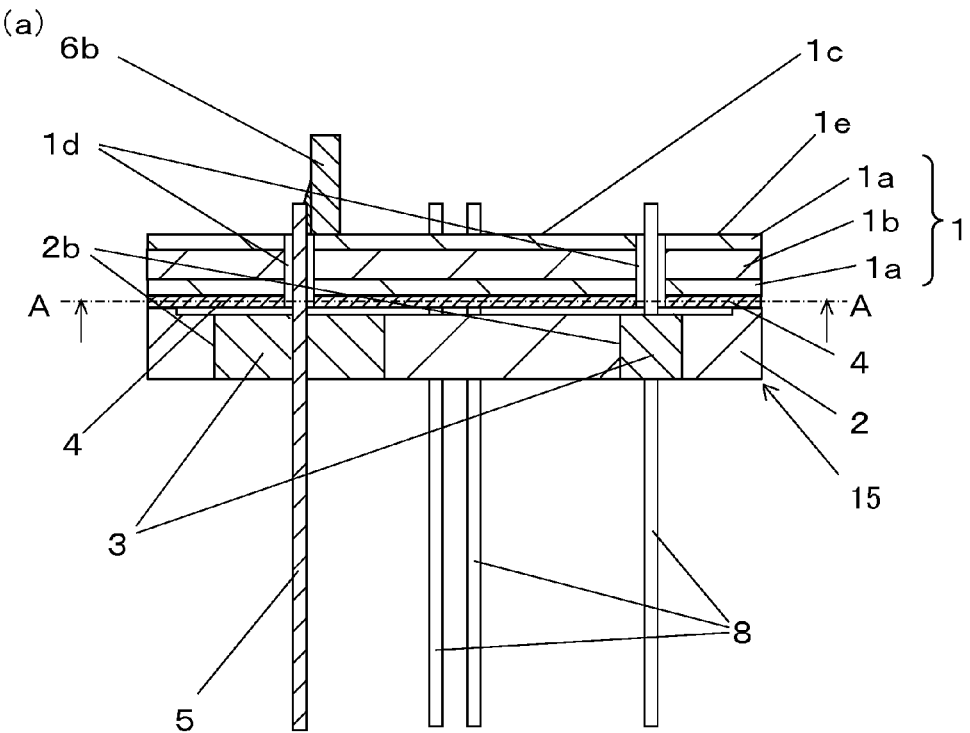
FIG. 9(a) is a cross-sectional view illustrating another example of the electronic component mounting package according to the embodiment of the invention.
FIG. 9(b) is a cross-sectional view illustrating a cross-section taken along the line A-A in FIG. 9(a)
Figure 9:
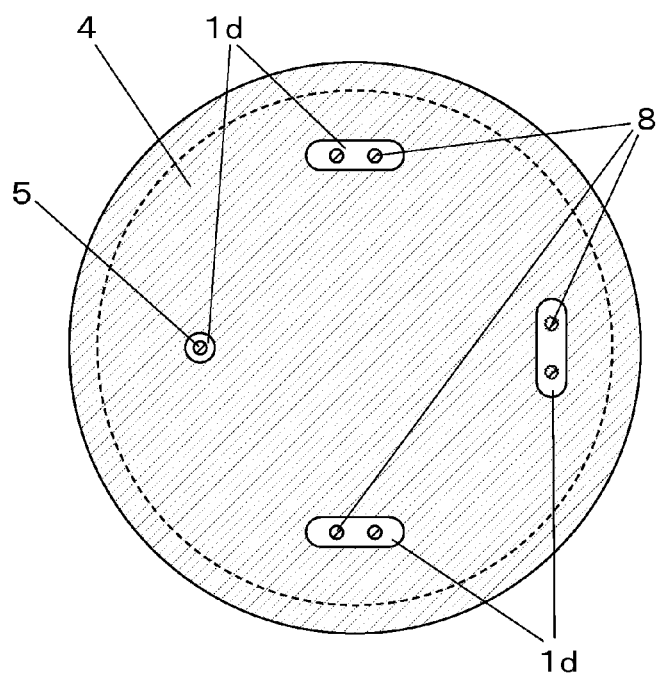
Figure 10:
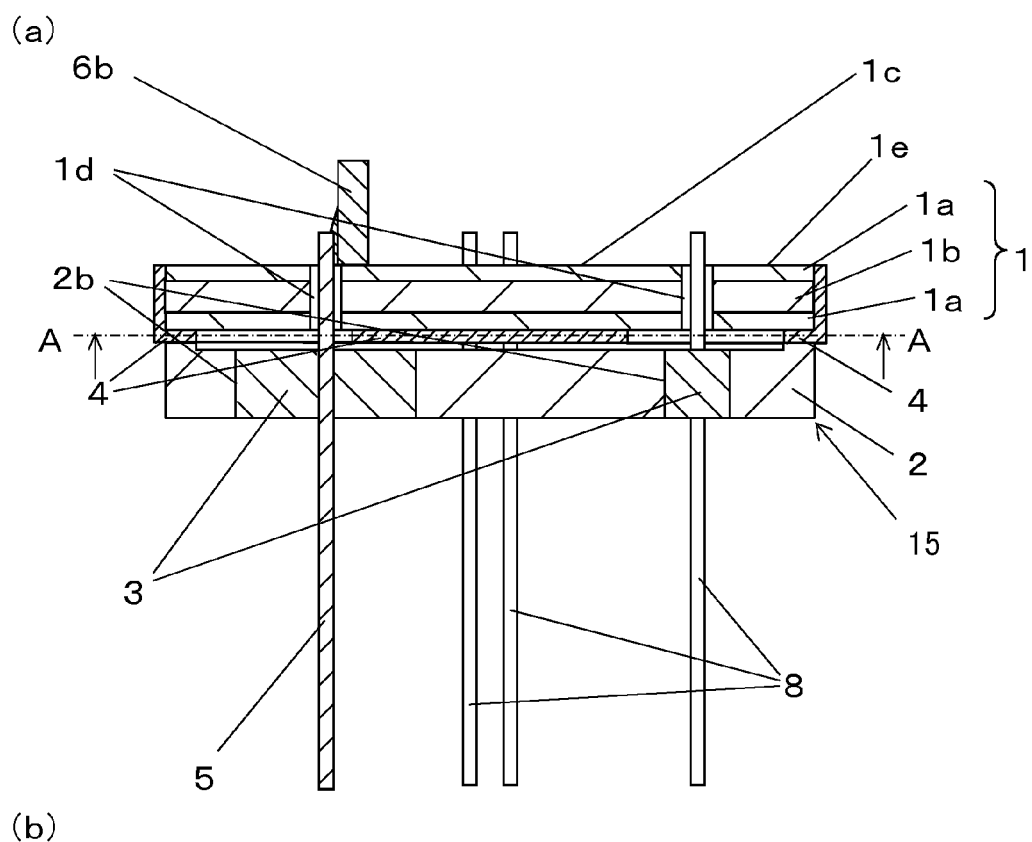
FIG. 10(a) is a cross-sectional view illustrating another example of the electronic component mounting package according to the embodiment of the invention.
FIG. 10(b) is a cross-sectional view illustrating a cross-section taken along the line A-A in FIG. 10(a)
Figure 10:
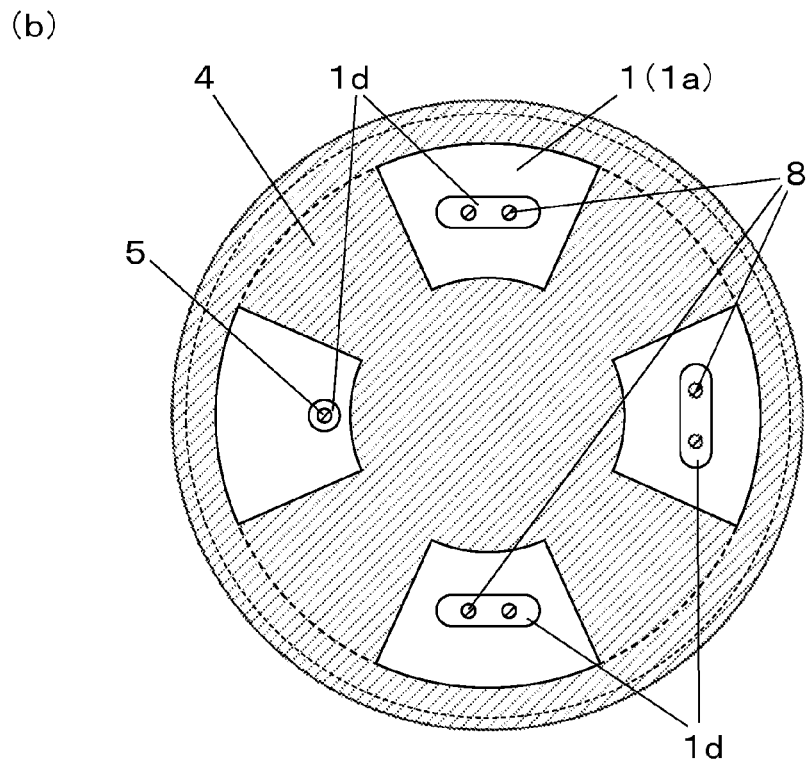
Figure 11:
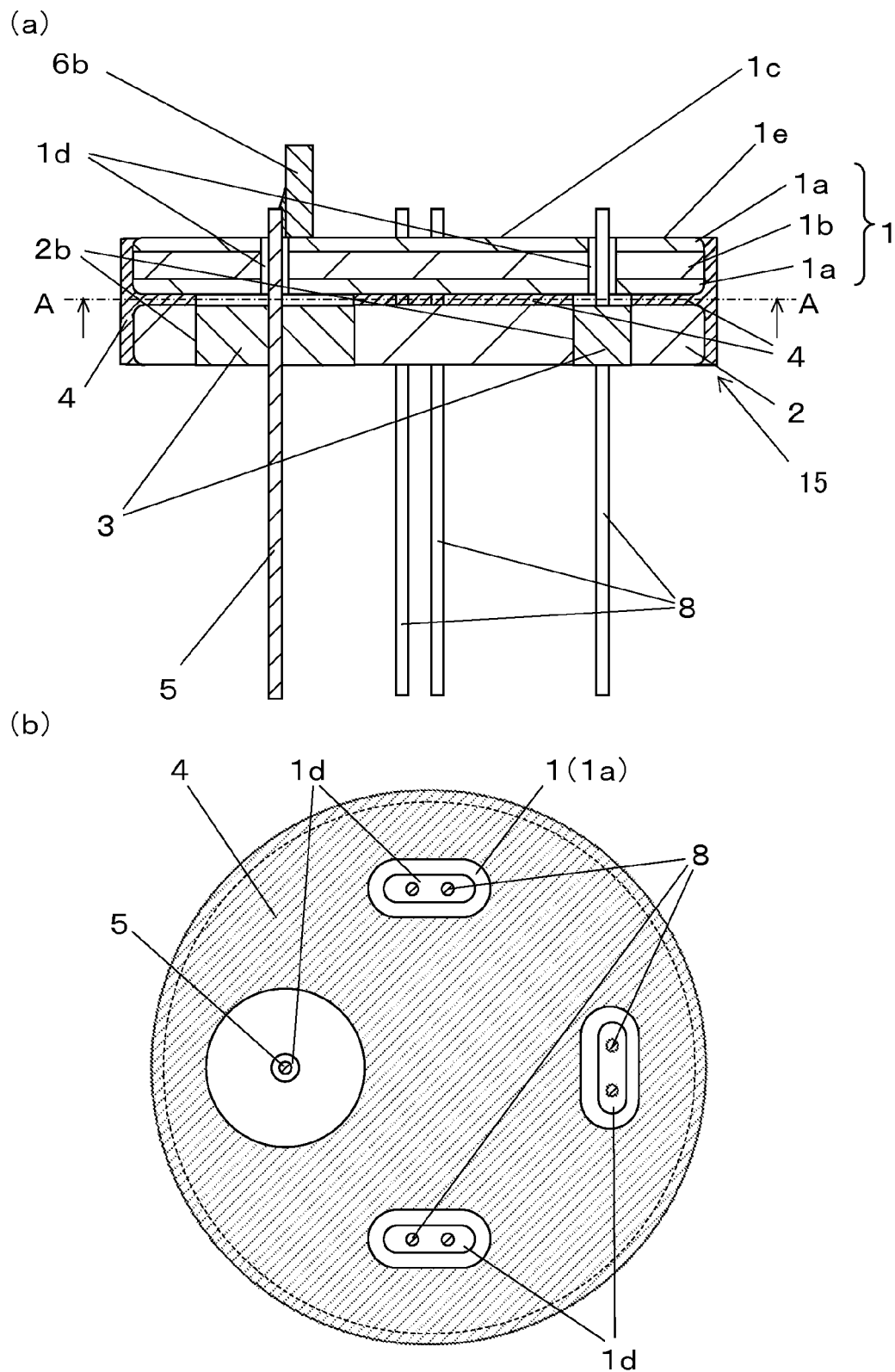
FIG. 11(a) is a cross-sectional view illustrating another example of the electronic component mounting package according to the embodiment of the invention.
FIG. 11(b) is a cross-sectional view illustrating a cross-section taken along the line A-A in FIG. 11(a).

Further, as in the examples shown in FIGS. 9 to 11, in the above configuration, when the bonding material 4 having the thermal conductivity higher than that of the first metal members 1a is coated from a portion of the lower surface of the first base 1, which is opposite to the mounting section 1c, to the periphery thereof and the second base 2 is bonded to the first base 1 by the bonding material 4 provided on the periphery thereof, the heat generated from the electronic component 6 is easily conducted to the side surface of the first base 1 through the bonding material 4 of the lower surface of the first base 1. Thus, a semiconductor element accommodating package capable of efficiently radiating the heat to the outside is achieved. Further, when a rounded portion or a chamfered surface is formed on the corner sections between the opposite surfaces of the first base 1 and the second base 2 and the side surfaces thereof, it is possible to form the configuration so that the bonding material 4 remains on the side surface of the bonding portion of the first base 1 and the second base 2. Thus, the heat is easily conducted to the side surface of the first base 1 through the bonding material 4, and thus, the electronic component mounting package 15 capable of efficiently radiating the heat to the outside is achieved.

Since the electronic apparatus according to the embodiment of the invention includes the electronic component mounting package 15 according to the embodiment of the invention having any one of the above-described configurations, the electronic component 6 mounted on the mounting section 1c of the electronic component mounting package 15, and the cover 9 that is bonded to the upper surface of the first base 1, it is possible to radiate the heat generated from the electronic component 6 from the side surface of the first base 1 to the outside through the second metal member 1b of the first base 1 having the high thermal conductivity with high efficiency, to thereby achieve a small electronic apparatus with a high output.

In the electronic apparatus according to the embodiment of the invention, in the above configuration, since the temperature control element 11 is provided between the electronic component 6 and the mounting section 1c, heat radiation efficiency is improved, and thus, it is possible to maintain a constant temperature of the electronic component 6 that generates more heat using the temperature control element 11. Thus, a characteristic change of the electronic component 6 generated due to the temperature change does not appear, and thus, an electronic apparatus having stable characteristics is achieved.

The first base 1 includes the first metal members 1a and the second metal member 1b, and the second metal member 1b is interposed between the first metal members 1a. It is preferable that the first metal members 1a has a thermal expansion coefficient close to that of the mounted electronic component 6 or the circuit board 6a made of ceramic. As a cheap material, a metal such as a ferrous alloy such as an Fe—Mn alloy or pure iron, or copper (Cu) or a copper alloy may be selected, for example. More specifically, an SPC (Steel Plate Cold) material based on Fe of 99.6% by mass and Mn of 0.4% by mass may be used. Further, it is preferable that the second metal member 1b has a high thermal conductivity. For example, a metal having a small Young's modulus such as copper (Cu) or aluminum (Al), or a metal having a small thermal expansion coefficient such as tungsten (W) or molybdenum (Mo) is preferable. The first base 1 is formed by bonding the first metal members 1a and the second metal member 1b. As a bonding method, a clad method of bonding the members by overlapping and rolling the members may be used, or a method of bonding the members using a bonding material having a high thermal conductivity such as a silver solder may be used. A metal processing method such as rolling or punching is performed in this way for the bonded material bonded to have a predetermined form, and then, the through-holes 1b are formed by drilling or punching using a die. Further, in a case where the first base 1 has the shape of a protruding portion as the mounting section 1c, it is possible to form the protruding portion by cutting or pressing.

The first base 1 has a flat plate shape of a thickness of 0.25 to 1 mm, and the shape is not particularly limited. That is, a disc shape of a diameter of 3 to 6 mm, a semi-disc shape obtained by cutting a part off from a circumference of a radius of 1.5 to 8 mm, a square plate shape of a side of 3 to 15 mm, or the like may be used.

It is preferable that the thickness of the first base 1 is 0.5 mm or more. In a case where the thickness is smaller than 0.5 mm, when the cover 9 made of metal for protection of the electronic component 6 is bonded to the upper surface of the first base 1 made of metal, the first base 1 is easily bent to be deformed according to bonding conditions such as a bonding temperature. Further, when the thickness exceeds 1 mm, the thickness of the electronic component mounting package 15 obtained by bonding with the second base 2 and the thickness of the electronic apparatus are unnecessarily increased, which results in difficulties in miniaturization. Thus, it is preferable that the thickness of the first base 1 is 1 mm or less. For miniaturization, it is preferable that the sum of the thickness of the first base 1 and the thickness of the second base 2 is 2 mm or less. Thus, as in the example shown in FIG. 7, in a case where the first base 1 has the concave portion 1f and the second base 2 is bonded to the first base 1 inside the concave portion 1f, the first base 1 may have a thickness of more than 1 mm and 2 mm or less.

In a case where the first metal members 1a are made of the SPC and the second metal member 1b is made of copper, it is preferable that the thickness of the first metal member 1a on the side of the mounting section 1c is 0.05 mm or more. When the thickness of the metal member 1a on the side of the mounting section 1c is smaller than 0.05 mm, in a case where the cover bonding is performed by electro-deposition, heat is transferred to the second metal member 1b, and thus, the temperature is easily decreased. Thus, cover bonding efficiency tends to be decreased. Further, it is preferable that the thickness of the second metal member 1b is 0.05 mm or more. When the thickness of the second metal member 1b is smaller than 0.05 mm, compared with a case where the first base 1 is configured by a single body made of the SPC material, there is a tendency that an effect of conducting heat toward the side surface is not distinctive.

Figure 4:
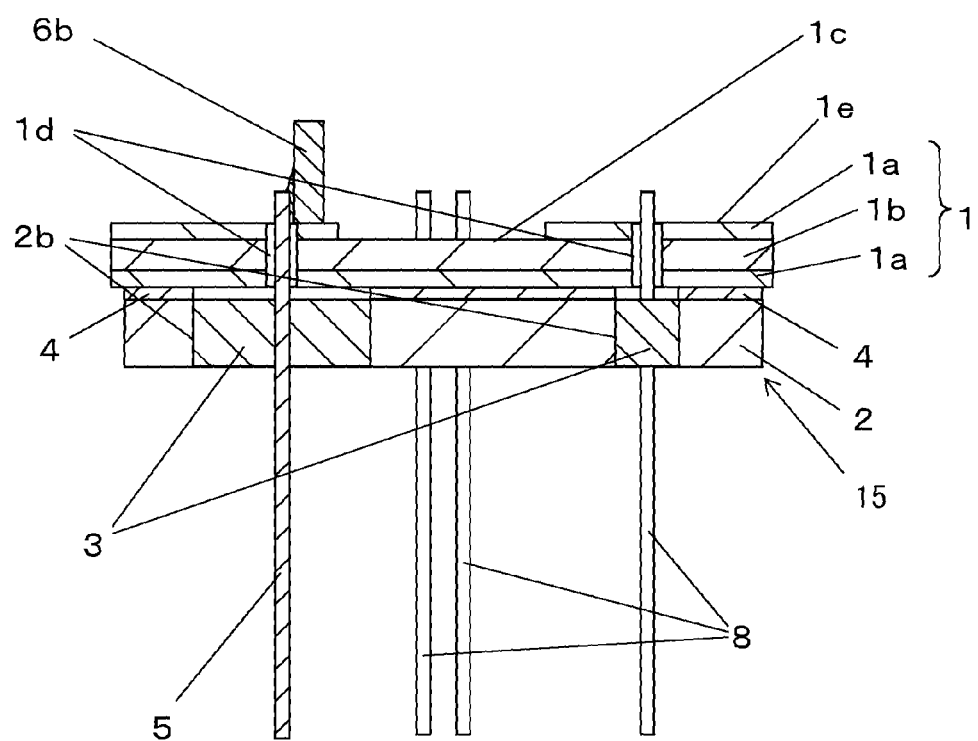
FIG. 4 is a cross-sectional view illustrating another example of the electronic component mounting package according to the embodiment of the invention.
Figure 5:
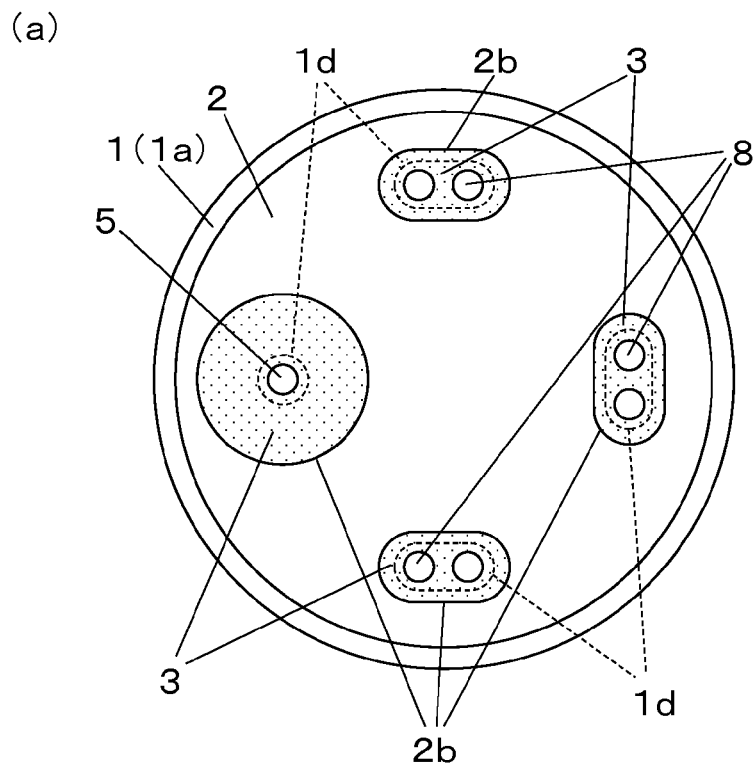
FIG. 5(a) is a bottom view illustrating an example of a lower surface of the electronic component mounting package of the invention shown in FIG. 3.
FIG. 5(b) is a bottom view illustrating another example of the electronic component mounting package of the invention.
Figure 5:
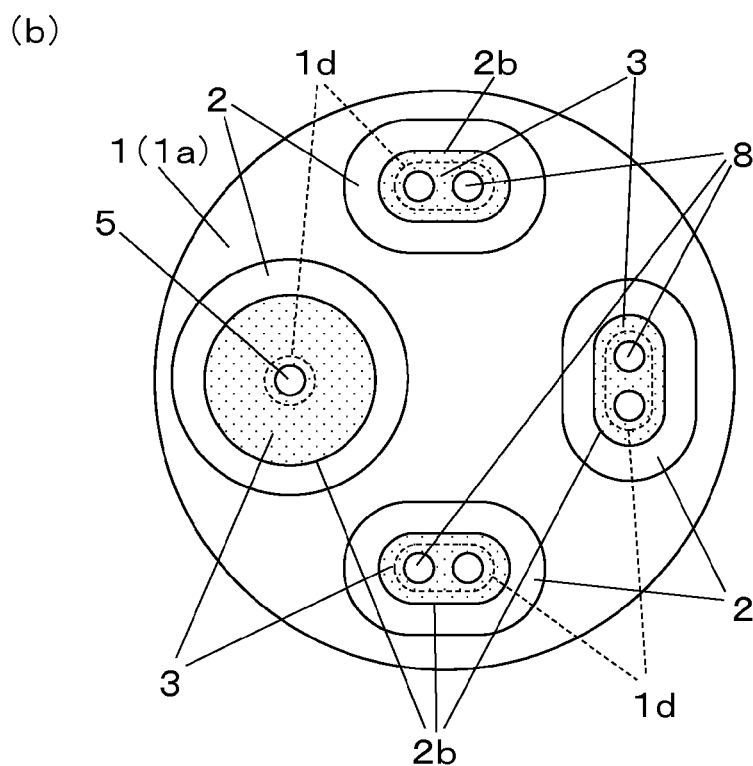

Further, in the first base 1, when the first metal members 1a are removed from the portion of the mounting section 1c as in the example shown in FIG. 4, it is possible to conduct the heat generated from the electronic component 6 to the second metal member 1b having a high thermal conductivity without passing through the first metal members 1a while suppressing the thermal expansion coefficient of the first base 1, and thus, thermal radiation efficiency to the side surface of the first base 1 is preferably increased. In order to achieve the configuration in which the first metal members 1a are removed from the portion of the mounting section 1c, the first metal members 1a may be cut off using a known cutting process or the like in the mounting section 1c of the first base 1 in which the second metal member 1b is interposed between the first metal members 1a, or a portion, corresponding to the mounting section 1c of the first metal member 1a which is bonded to the second metal member 1b being interposed, may be punched in advance for bonding.

Around the mounting section 1c, a plurality of first through-holes 1d having a diameter of 0.23 to 1.15 mm and penetrating from the upper surface of the first base 1 to the lower surface thereof are provided. The diameter of the first through-hole 1d through which the signal terminal 5 passes has a size such that an air-coaxial structure having a characteristic impedance of 50 Ω is formed as the signal terminal 5 passes through the center thereof. For example, in a case where the diameter of the signal terminal 5 is 0.2 mm, the diameter of the first through-hole 1d may be 0.46 mm. With respect to the first through-hole 1d through which the DC terminals 8 pass, since the DC terminals 8 are not affected by the characteristic impedance, the size may be smaller than the above-mentioned size such that the DC terminals 8 and the first base 1 are not short-circuited, to thereby increase the area of the mounting section 1c. Further, the first through-hole 1d may be conversely larger than the above-mentioned size so that the plurality of DC terminals 8 passes therethrough as in the example shown in FIG. 1. In this case, for example, as in the example shown in FIG. 1, it is possible to enlarge the area of the mounting section 1c by forming an ellipse instead of a circle. As described above, since the number of the signal terminals 5 is determined according to the number of the electronic components 6 and the number of terminals of the electronic components 6, and the number of the DC terminals 8 is determined according to the number of different elements other than the electronic component 6, the number of the first through-holes 1d may be appropriately formed accordingly.

Further, it is preferable that a Ni layer of a thickness of 0.5 to 9 μm with excellent corrosion resistance and excellent wettability with respect to a brazing material, and an Au layer of a thickness of 0.5 to 5 μm are sequentially coated on the surface of the first base 1 by plating. Thus, it is possible to effectively prevent the first base 1 from being subjected to oxidation corrosion, and to favorably solder the electronic component 6, the circuit board 6a, the cover 9 or the like to the first base 1.

The second base 2 has a function of fixing the signal terminal 5 and the DC terminals 8 in the second through-holes 2b through the sealing material 3, and a function of air-tightly sealing the electronic component 6 by the sealing material 3 and the bonding material 4 in cooperation with the cover 9. Thus, the second base 2 is bonded to the first base 1 in the periphery thereof so that the bonding portion of the first base 1 and the second base 2 surrounds the first through-holes 1d. When the bonding is performed at least on the periphery thereof, the airtight sealing may be achieved. Thus, as in the example shown in FIG. 11, the entire upper surface of the second base 2 may be bonded to the lower surface of the first base 1 by the bonding material 4.

Further, the second base 2 has a flat plate shape of the same thickness of 0.25 to 1 mm as that of the first base 1. The shape thereof is not particularly limited, but a disc shape of a diameter of 3 to 6 mm, a semi-disc shape obtained by cutting a part off from a circumference of a radius of 1.5 to 8 mm, a quadrangle plate shape of a side of 3 to 15 mm, or the like may be used, for example. Since the periphery of the second base 2 is bonded to the lower surface of the first base 1, it is sufficient that the second through-holes 2b of a necessary size are formed therein and the periphery thereof is larger than that of the first through-hole 1d. For example, as in the example shown in FIGS. 3 and 5(a), the second base 2 having the outer appearance that is slightly smaller than that of the first base 1 in a plan view may be bonded to the lower surface of the first base 1 so that the plurality of first through-holes 1d is collectively sealed, or as in the example shown in FIG. 5(b), a plurality of second bases 2 that are respectively and slightly larger than the plurality of first through-holes 1d may be provided so that the plurality of first through-holes 1d are respectively sealed. Further, when the second base 2 is small in this way, in a case where an expansion coefficient difference is present between the second base 2 and the first base 1, generated thermal stress is small, which is preferable. When the entire signal terminals 5 of the electronic component mounting package 15 are fixed to one second base 2, when the first base 1 and the second base 2 are bonded with each other, it is possible to accurately position relative positions of the signal terminals 5, and to perform positioning of the plurality of first through-holes 1d and the plurality of second through-holes 2b (and the plurality of signal terminals 5 fixed in the second through-holes 2b) in a lump, and thus, it is possible to efficiently obtain the electronic component mounting package 15 with high assembly accuracy.

It is preferable that the thickness of the second base 2 is 0.5 mm or more. In a case where the thickness is smaller than 0.5 mm, the second base 2 is easily deformed by stress from the outside, and thus, it is difficult to maintain air-tightness of the sealing material 3. Further, when the thickness exceeds 1 mm, the thickness of the electronic component mounting package 15 obtained by bonding with the first base 1 and the thickness of the electronic apparatus are unnecessarily increased, which results in difficulties in miniaturization, and thus, it is preferable that the thickness of the second base 2 is 1 mm or less.

The second base 2 has the second through-hole 2b having a diameter of 0.53 to 2.65 mm and penetrating from the upper surface to the lower surface for fixing the signal terminal 5. The position of the second base 2 is disposed so that the second through-hole 2b for fixing the signal terminal 5 is concentrically positioned with respect to the first through-hole 1d through which the signal terminal 5 passes. Further, the second through-holes 2b for fixing the DC terminals 8 may be formed to have such a size that the sealing material 3 having a sufficient thickness (about 0.2 mm) is inserted between the DC terminals 8 and an inner surface of the second through-holes 2b at positions that are overlapped with the first through-holes 1d through which the DC terminals 8 pass in a plan view.

It is preferable that the above-described second base 2 is made of a metal such as an Fe—Ni—Co alloy or an Fe—Ni alloy, as a metal having a thermal expansion coefficient close to that of the sealing material 3 or a cheap material. For example, in a case where the second base 2 is made of the Fe—Ni—Co alloy, the second base 2 may be manufactured to have a predetermined shape by performing a metal processing method such as rolling or punching for an ingot of the alloy. Thereafter or at the same time, the second through-holes 2b are formed by drilling or punching using a die.

Further, in a similar way to the first base 1, it is preferable that a Ni layer of a thickness of 0.5 to 9 μm with excellent corrosion resistance and excellent wettability with respect to a brazing material and an Au layer of a thickness of 0.5 to 5 μm are sequentially coated by plating on the surface of the second base 2. Thus, it is possible to effectively prevent the second base 2 from being subjected to oxidation corrosion, and to favorably bond the second base 2 to the first base 1 by brazing.

The formation of the groove 10 has the effects of alleviating thermal stress between the first base 1 and the second base 2 due to heat generated from the mounted electronic component 6, alleviating impact in bonding of the cover 9 or thermal stress after bonding of the cover 9, and easily radiating the heat generated from the cover bonding section 1e. In order to achieve the above effects, the groove 10 may be formed in at least one of the first base 1 and the second base 2. Further, since the groove 10 is formed to prevent damage of a sealing property of the signal terminal 5 in the second through-hole 2b by heat in bonding of the cover 9, in a case where the groove 10 is formed in the second base 2, the groove 10 of the second base 2 may be formed between the bonding portion with respect to the first base 1 and the second through-hole 2b.

In the example shown in FIG. 6, since the groove 10 perpendicular only to the main surface of the second base 2 inside the bonding portion of the first base 1 and the second base 2 is formed, the heat conduction from the mounting section 1c of the first base 1 to the side surface (outside) is not disturbed, which is preferable. In a case where the thermal expansion coefficient difference is large between the first base 1 and the second base 2, a groove may be formed inside the bonding portion of the first base 1 and the second base 2 on the lower surface of the first base 1.

Further, as in the example shown in FIG. 7, when the first base 1 has the concave portion 1f on the lower surface, and the second base 2 is bonded to the first base 1 in the concave portion 1f (side surface of the concave portion 1f), the groove 10 of the first base 1 is formed in a protruding portion in the vicinity of the concave portion 1f. In this case, as in the example shown in FIG. 7, the groove 10 may be formed on the main surface (top surface) of the protruding portion, or may be formed on the inner surface of the protruding portion. When the groove 10 is formed on the main surface of the protruding portion, it is easy to form the groove 10 by pressing or the like, whereas when the groove 10 is formed in the inner surface of the protruding portion, a conduction path of the heat generated from the cover bonding section 1e to the second base 2 is lengthened, which is preferable.

It is preferable that the groove 10 is formed over the whole circumference along the bonding portion of the first base 1 and the second base 2 in order to alleviate thermal stress generated due to the different thermal expansion coefficients of the first base 1 and the second base 2. For example, as in the example shown in FIG. 7, in a case where the second base 2 is bonded to the first base 1 on the side surface of the second base 2 and a groove is formed on the lower surface of the second base 2, even though the groove 10 does not have a continuous form as in the example shown in FIG. 8(a), a plurality of grooves 10 that are not continuous is formed over the whole circumference along the bonding portion of the first base 1 and the second base 2 as in the example shown in FIG. 8(b), and when a discontinuous portion of one groove 10 is formed to be overlapped with a different groove 10 when seen from the bonding portion to places where the grooves 10 are formed, it is possible to preferably alleviate the stress over the whole circumference of the second base 2. Further, double or more continuous grooves 10 may be formed, for example, double grooves 10 may be formed in a portion where the distance between the bonding portion of the first base 1 and the second base 2 and the second through-hole 2b is short (for example, in a case where the inner groove 10 in FIG. 8(*b*) is continuous) so that the heat is hardly transferred to the sealing material 3.

The width and depth of the groove 10 may have a size such that the thermal stress can be alleviated at the portion and the heat generated from the cover bonding section 1e can be radiated, and may be set according to the materials of the first base 1 and the second base 2. The first metal members 1a are made of the SPC having a thickness of 0.2 mm, and the second metal member 1b is made of copper having a thickness of 0.2 mm. Since the thermal expansion coefficient of the first base 1, obtained when the second metal member 1b is vertically clad by the first metal members 1a, is increased by 20% or less compared with the thermal expansion coefficient of the SPC material of the first metal members 1a, this is not noticeably different from a case where the first base 1 is made of the SPC. Further, in a case where the second base 2 is made of the Fe—Ni—Co alloy and the groove 10 is perpendicularly formed to the main surface of the second base 2 as in the example shown in FIG. 6, when the depth of the groove 10 is formed to be a thickness that is 0.1 to 0.25 mm smaller than the thickness of the first base 1 or the second base 2, that is, when the thickness of a bottom portion of the groove 10 is formed to be 0.1 to 0.25 mm, the effect of stress alleviation due to the portion of the groove 10 is enhanced and air-tightness is also increased, which is preferable. As the thickness of the bottom portion of the groove 10 is thin, the stress alleviation effect is increased, but when the thickness of the bottom portion of the groove 10 is smaller than 0.1 mm, deformation in the portion of the groove 10 becomes severe, and thus, when the electronic component 6 is mounted and used, as the thermal stress is repetitively applied, a crack may be generated from the bottom portion of the groove 10, which results in reduction in air-tightness. For the same reason, it is preferable that the cross-section of the groove 10 has a shape obtained by rounding corners formed by the bottom surface and the side surfaces, or a U shape.

The signal terminal 5 and the DC terminals 8 are made of a metal such as an Fe—Ni—Co alloy or an Fe—Ni alloy. For example, in a case where the signal terminal 5 is made of the Fe—Ni—Co alloy, the signal terminal 5 may be manufactured to have a linear shape with a length of 1.5 to 22 mm and a diameter of 0.1 to 0.5 mm by performing a metal processing method such as rolling or punching for an ingot of the alloy.

The signal terminal 5 and the DC terminals 8 are fixed through the sealing materials 3 so that the lower end portions thereof protrude from the second through-holes 2b of the second base 2 by at least about 1 to 20 mm. Here, the upper end portions thereof protrude from the first through-holes 1d of the first base 1 by about 0 to 2 mm.

When the DC terminal 8 is used for a ground, the DC terminal 8 may be connected to the lower surface of the second base 2 using a brazing material or the like.

The sealing material 3 is made of an inorganic material such as glass or ceramics, and has a function of securing an insulation interval between the signal terminal 5 and the DC terminals 8, and the second base 2. Further, a function of fixing the signal terminal 5 and the DC terminals 8 into the second through-holes 2b is achieved. As an example of the above-described sealing material 3, a glass such as a borosilicate glass or a soda-lime glass, or a material obtained by adding a ceramic filler for adjustment of a thermal expansion coefficient and a relative permittivity of the sealing material 3 to the above glass may be used. Here, the relative permittivity is appropriately selected for impedance matching. As the filler that reduces the relative permittivity, lithium oxide or the like may be used. For example, in order to set a characteristic impedance to 50Ω, in a case where the outer diameter of the signal terminal 5 is 0.2 mm, the inner diameter of the air-coaxial first through-hole 1d may be set to 0.46 mm, the inner diameter of the second through-hole 2b may be set to 1.75 mm, and the sealing material 3 having a relative permittivity of 6.8 may be used. Further, in a case where the outer diameter of the signal terminal 5 is 0.25 mm, the inner diameter of the first through-hole 1d may be set to 0.57 mm, the inner diameter of the second through-hole 2b may be set to 2.2 mm, and the sealing material 3 having a relative permittivity of 6.8 may be used. Further, in a case where the outer diameter of the signal terminal 5 is similarly 0.25 mm, the inner diameter of the second through-hole 2b may be set to 1.65 mm, and the sealing material 3 having a relative permittivity of 5 may be used. When the relative permittivity of the sealing material 3 is 4, in the case of the same outer diameter of 0.25 mm, when the inner diameter of the second through-hole 2b is 1.35 mm, the characteristic impedance becomes 50Ω.

As the relative permittivity of the sealing material 3 is small, it is possible to adjust the impedance to 50Ω even though the second through-hole 2b is small in diameter, which is consequently effective in reduction of the size of the first base 1 to be bonded on the upper surface of the second base 2, thereby making it possible to achieve a smaller electronic component mounting package.

It is sufficient that the sealing material 3 for fixing the DC terminal 8 can fix the DC terminal 8 by airtight sealing without the necessity of particularly considering the impedance, and thus may not be the same as the sealing material 3 for fixing the signal terminal 5. In order to fix the signal terminal 5 and the DC terminals 8 at the same time, the same glass as the sealing material 3 for fixing the signal terminal 5 or a glass having substantially the same melting point as that of the sealing material 3 may be used.

In a case where the sealing material 3 is made of glass, the sealing material 3 of glass which is molded by powder pressing, extrusion molding or the like in a cylindrical shape in which the inner diameter thereof is larger than the outer diameter of the signal terminal 5 or the DC terminals 8 and the outer diameter thereof is smaller than the inner diameter of the second through-hole 2b, is inserted into the second through-hole 2b, and the signal terminal 5 or the DC terminals 8 are inserted into the sealing material 3. Then, the sealing material 3 is heated at a predetermined temperature to be fused, and thus, the signal terminal 5 or the DC terminals 8 are buried in the sealing material 3 and are air-tightly fixed to the second through-hole 2b to be insulated from the second base 2. The signal terminal 5 forms a favorable coaxial transmission path by being fixed to the center of the second through-hole 2b, to thereby make it possible to favorably transmit a high frequency signal.

The bonding of the first base 1 and the second base 2 may be performed using the bonding material 4 capable of bonding and air-tightly sealing, such as a brazing material, solder or glass. For example, the bonding material 4 manufactured by punching a solder foil that uses an alloy solder of gold (Au) of 80% by mass and tin (Sn) of 20% by mass, gold (Au) of 88% by mass and germanium (Ge) of 12% by mass, or tin (Sn) of 96.5% by mass and silver (Ag) of 3.5% by mass in the shape of the bonding surface by a die or the like is interposed between the bonding surfaces of the first base 1 and the second base 2, and is heated at a temperature equal to or higher than a melting point of the alloy solder in nitrogen and then is cooled. Thus, the first base 1 and the second base 2 are bonded to each other. For example, a silver solder may be used as the brazing material, and a low melting point glass may be used as the glass. Further, instead of the foil, paste of the bonding material 4 may be coated on the bonding surface to be heated.

Since the thermal conductivity of the first base 1 is higher than the thermal conductivity of the second base 2, for example, in a case where the first base 1 having the configuration in which the second metal member 1b made of copper of a thickness of 0.2 mm is vertically interposed between the first metal members 1a respectively made of the SPC material of a thickness of 0.2 mm, and the second base 2 made of the Fe—Ni—Co alloy are used, since the thermal conductivity of the SPC material is 80 W/(m·K) and the thermal conductivity of the copper is 393 W/(m·K), the thermal conductivity of the first base 1 in the direction of the side surface becomes about 130 W/(m·K), and since the thermal conductivity of the Fe—Ni—Co alloy is 30 W/(m·K), the electronic apparatus mounted with the electronic component 6 on the first base 1 with the high thermal conductivity may favorably radiate the heat generated from the electronic component 6 in use to the outside through the first base 1 with the high thermal conductivity. Thus, a highly reliable electronic apparatus is achieved. Further, the heat generated in the cover bonding section 1e is easily conducted inside the first base 1 with the high thermal conductivity, and is hardly conducted to the second base 2 with the low thermal conductivity, and thus, occurrence of fracture, separation or the like in the sealing material 3 due to the heat is prevented, which is preferable. As in the examples shown in FIGS. 2, 3, 6, 7, 9, and 10, in a case where the second base 2 is bonded to the first base 1 only in the periphery thereof, since a conduction path of the heat to the second base 2 is short, occurrence of fracture, separation or the like of the sealing material 3 is more reliably prevented.

Further, in a case where the first base 1 having the configuration in which the second metal member 1b made of copper of a thickness of 0.2 mm is vertically interposed between the first metal members 1a made of the SPC material of a thickness of 0.2 mm is used, and in a case where the first metal members 1a made of the SPC material are removed as in the example shown in FIG. 4 from the portion of the mounting section 1c, heat is directly transferred to the second metal member 1b made of copper without being transferred through the first metal members 1a made of the SPC material, and thus, the thermal conductivity of the first base 1 in the direction of the side surface is about 230 W/(m·K), to thereby make it possible to enhance thermal radiation to the side surface, which is preferable.

Further, in the case of the combination of the first base 1 made of clad material in which the second metal member 1b made of copper is vertically interposed between the first metal members 1a made of the SPC material in which each layer has a thickness of 0.2 mm and the second base 2 made of the Fe—Ni—Co alloy, since the thermal expansion coefficient of the second base 2 made of the Fe—Ni—Co alloy is $4\times10^{-6}$ to $6\times10^{-6}/°$ C., for example, a glass that has a small relative permittivity of 4 and a thermal expansion coefficient of $3\times10^{-6}/°$ C. close to the thermal expansion coefficient of the Fe—Ni—Co alloy, and includes $SiO_2$ of 72% by mass, $B_2O_3$ of 25% by mass and other components is preferably used as the sealing material 3. Since the relative permittivity of the sealing material 3 is also small, it is possible to reduce the sizes of the second through-holes 2b and the second base 2, to thereby miniaturize the electronic component mounting package 15. Here, the first base 1 is small, but since the first through-hole 1d formed in the first base 1 is favorably small, it is possible to increase the ratio of the area of the entire upper surface of the first base 1 to the area of the mounting section 1c, to thereby efficiently transfer the heat generated from the electronic component 6 to the first base 1. Further, since the glass of which the relative permittivity is small generally has a small thermal expansion coefficient of $2\times10^{-6}/°$ C. to $5\times10^{-6}/°$ C., when an Fe—Ni—Co alloy having a relatively small thermal expansion coefficient ($4\times10^{-6}$ to $6\times10^{-6}/°$ C.) is used as the second base 2 with respect to the highly thermal conductive clad material (transverse thermal expansion coefficient: $10\times10^{-6}$ to $12\times10^{-6}/°$ C.) in which the copper is interposed between the SPC materials, even though the inside of the second through-hole 2b is filled, separation or fracture does not occur due to the thermal expansion difference from the second base 2. In the electronic component mounting package 15 according to the embodiment of the invention, by forming the first base 1 mounted with the electronic component 6 and the second base 2 in which the signal terminal 5 is fixed by the sealing material 3 by different materials having individually necessary characteristics, an electronic apparatus having a small size and excellent reliability is achieved.

In a case where the bonding material 4 having a thermal conductivity higher than that of the first metal members 1a is coated from the portion that faces the mounting section 1c of the lower surface of the first base 1 to the periphery thereof, the bonding material 4 may be coated so that a plurality of heat conduction paths is provided between the portion that faces the mounting section 1c and the periphery, as in the example shown in FIG. 10, but when the bonding material 4 is coated on the entire lower surface of the first base 1 as in the example shown in FIG. 9, the heat conduction path from the portion that faces the mounting section 1c to the periphery becomes the maximum, to thereby more efficiently radiate the heat, which is preferable. Further, in a case where the upper surface of the second base 2 and the lower surface of the first base are bonded with each other by the bonding material 4 on the entire surfaces, as in the example shown in FIG. 11, it is preferable that the bonding material 4 is coated on the lower surface of the first base 1 except portions overlapped with the second through-holes 2b of the second base 2, at least a portion overlapped with the through-hole 2b in which the signal terminal 5 is fixed to prevent contact of the sealing material 3 and the bonding material 4. Then, in a case where the bonding material 4 is a conductive brazing material, it is possible to suppress generation of stray capacitance between the signal terminal 5 in the second through-hole 2b and the bonding material 4, and in a case where the bonding material 4 is made of a dielectric body such as glass, it is possible to suppress increase in stray capacitance between the signal terminal 5 in the second through-hole 2b and the first base 1. Thus, deterioration of the signal transmission characteristics due to characteristic impedance fluctuation by the stray capacitance does not occur.

For example, in a case where the first metal members 1a are made of the SPC material, a silver solder in which silver having a high thermal conductivity is used as a main component, for example, an alloy of Ag of 72% by mass and Cu of 28% by mass (thermal conductivity: 374 W/(m·k)) is used as the bonding material 4 having the thermal expansion coefficient higher than that of the first metal members 1a. The silver solder is BAg-8 of JIS (Japan Industrial Standard), but other silver solders may be used. Further, a material obtained by adding indium (In) of about 1% by mass to 10% by mass may be used in order to reduce the melting point and hardness as necessary. The thermal expansion coefficient of the bonding material 4 may be measured by processing the bonding material 4 in a shape based on JISK 7197-1991, by a measurement method based on JISK 7197-1991 using a TMA (Thermo Mechanical Analysis) apparatus that is commercially available.

Further, in a case where the bonding material 4 is coated on the lower surface of the first base 1, as in the example shown in FIG. 10, the bonding material 4 may be extended to the side surface of the first base 1 for coating. Then, the heat radiation to the outside is further improved. Further, as in the example shown in FIG. 11, the bonding material 4 may be extended to the side surface of the second base 2 in addition to the side surface of the first base 1 for coating to increase the heat radiation area, thereby improving the heat radiation. Further, as in the example shown in FIG. 11, when the rounded portion or the chamfered surface is formed on the corner sections between the opposite surfaces of the first base 1 and the second base 2 and the side surfaces thereof, it is possible to form the bonding material 4 to remain on the side surface of the bonding portion of the first base 1 and the second base 2, and thus, the heat conduction to the side surface side of the first base 1 is easily performed through the bonding material 4. Thus, it is possible to more efficiently radiate the heat to the outside, which is preferable. Further, in this case, when a material that is softer than the first base 1 is used as the bonding material 4, the contact ability is increased when an object to be a radiator is in close contact with the side surface of the first base 1, and thus, it is possible to more efficiently transfer the heat to the radiator.

As the electronic component 6 is mounted onto the mounting section 1c of the electronic component mounting package 15 according to the embodiment of the invention and the cover 9 is bonded to the cover bonding section 1e of the first base 1, the electronic apparatus according to the embodiment of the invention is achieved.

As the electronic component 6, an optical semiconductor device such as an LD (Laser Diode) or a PD (PhotoDiode), a semiconductor device including a semiconductor integrated circuit device, a piezoelectric device such as a quartz oscillator or a surface acoustic wave device, a pressure sensor device, a capacitive device, a resistor or the like may be used.

An insulating substrate of the circuit board 6a and the relay board 6b is made of a ceramic insulating material or the like such as an aluminum oxide (alumina: $Al_2O_3$) sintered body or an aluminum nitride (AlN) sintered body. In a case where the insulating substrate is made of the aluminum oxide sintered body, for example, first, an appropriate organic solvent or medium is added and mixed with base powder such as alumina ($Al_2O_3$) or silica ($SiO_2$), calcia (CaO) or magnesia (MgO) to form a slurry form, which is molded in a sheet form by a doctor blade method, a calender roll method or the like to achieve a ceramic green sheet (hereinafter, referred to as a green sheet). Then, the green sheet is punched in a predetermined shape, and a plurality of sheets is stacked as necessary. Then, the green sheet is fired at a temperature of about 1600° C. to manufacture the insulating substrate. Then, grinding may be performed on the main surface of the insulating substrate as necessary.

A wiring conductor is formed on the upper surface of the insulating substrate using a deposition method and a photolithography method, to thereby achieve the circuit board 6a and the relay board 6b. The wiring conductor is formed by a conductive layer of a three-layer structure in which a contact metal layer, an anti-diffusion layer and a main conductor layer are sequentially stacked, for example. Further, the wiring conductor through which a high frequency signal runs, and formed on the circuit board 6a and the relay board 6b, is provided as a transmission path by adjusting the characteristic impedance to 50Ω, for example, as in the portion of the second through-hole 2b of the signal terminal 5.

From the viewpoint of favorable contact ability with the insulating substrate made of ceramics or the like, it is preferable that the contact metal layer is made of at least one of metals of which the thermal expansion coefficient is close to the ceramics, such as titanium (Ti), chromium (Cr), tantalum (Ta), niobium (Nb), a nickel chromium (Ni—Cr) alloy and tantalum nitride (Ta2N), and it is preferable that the thickness is about 0.01 to 0.2 μm. When the thickness of the contact metal layer is smaller than 0.01 μm, there is a tendency that it is difficult to bring the contact metal layer in firm and close contact with the insulating substrate, and when the thickness exceeds 0.2 μm, there is a tendency that the contact metal layer is easily separated from the insulating substrate by internal stress in film formation.

Further, from the viewpoint to prevent mutual diffusion between the contact metal layer and the main conductive layer, it is preferable that the anti-diffusion layer is made of at least one of metals having favorable thermal conductivity such as platinum (Pt), palladium (Pd), rhodium (Rh), nickel (Ni), a Ni—Cr alloy and a Ti—W alloy, and it is preferable that the thickness is about 0.05 to 1 μm. When the thickness of the anti-diffusion layer is smaller than 0.05 μm, there is a tendency that defects such as pin-holes are generated to cause difficulties in the function as the anti-diffusion layer, and when the thickness exceeds 1 μm, there is a tendency that the anti-diffusion layer is easily separated from the contact metal layer by internal stress in film formation. In a case where the Ni—Cr alloy is used as the anti-diffusion layer, since the Ni—Cr alloy has favorable contact ability with the insulating substrate 4, it is possible to omit the contact metal layer.

Further, it is preferable that the main conductive layer is made of at least one of gold (Au), Cu, Ni and silver (Ag) having a small electrical resistance, and it is preferable that the thickness is about 0.1 to 5 μm. When the thickness of the main conductor layer is smaller than 0.1 μm, there is a tendency that the electrical resistance is too large to satisfy a necessary electrical resistance in the wiring conductor of the circuit substrate 6a, and when the thickness exceeds 5 μm, there is a tendency that the main conductor layer is easily separated from the anti-diffusion layer by internal stress in film formation. Since Au is an expensive noble metal, it is preferable that the thickness is as thin as possible from the viewpoint of cost reduction. Further, since Cu is easily oxidized, a protective layer made of Ni and Au may be coated thereon.

In the case of the example shown in FIG. 1, for example, on the surface of a grounded conductor of the lower surface of the circuit board 6a and the relay board 6b, a solder having a melting point of 200 to 400° C. or paste of a low melting point brazing material such as gold (Au)-tin (Sn) is printed by a screen printing method, a film of the low melting point brazing material is formed by a photolithography method, and a pre-form of the low melting point brazing material is arranged. Then, the circuit board 6a and the relay board 6b are fixed to the first base 1, by heating at a temperature of 200 to 400° C. Further, the electronic component 6 is soldered and fixed to the circuit board 6a bonded to the mounting section 1c by a brazing material such as Au—Sn having a melting point of 200 to 400° C., and is electrically connected to the signal terminal 5 by connecting the electrode thereof and the wiring conductor of the circuit board 6a through the bonding wire 7 and connecting the wiring conductor and the signal terminal 5 by the bonding wire 7. Further, for example, in a case where the circuit board 6a is mounted on the first base 1 and then the electronic component 6 is mounted on the circuit board 6a afterward, a gold-tin (Au—Sn) alloy or a gold-germanium (Au—Ge) alloy may be used as the brazing material to fix the circuit board 6a, and a tin-silver (Sn—Ag) alloy or a tin-silver-copper (Sn—Ag—Cu) alloy having a lower melting point than the brazing material or an adhesive made of resin such as Ag epoxy capable of being cured at a temperature lower than the melting point may be used to fix the electronic component 6. Further, the electronic component 6 may be mounted on the circuit board 6a, and then the circuit board 6a may be mounted on the first base 1 afterward. In this case, conversely, it is preferable that the melting point of the brazing material used when the circuit board 6a is mounted on the first base 1 is relatively low. In any case, paste of the brazing material may be printed on the circuit board 6a or the mounting section 1c of the first base 1 by a known screen printing method, the brazing material layer may be formed by a photolithography method, or a pre-form of the low melting point brazing material may be mounted, for example.

In a case where a high output LD element is mounted as the electronic component 6, in order to effectively cool the electronic component 6 and to prevent a characteristic change of the electronic component 6 due to a temperature change, the temperature control element 11 may be mounted on the mounting section 1c of the electronic component mounting package 15, and the electronic component 6 may be mounted thereon, as in the example shown in FIGS. 1 and 2. In the mounting method, fixing may be performed by a low melting point brazing material, as in the above description. In FIGS. 1 and 2, an example in which output from the LD element is reflected upwardly by the reflecting mirror 13 is shown, but an L-shaped stand may be formed on the temperature control element 11 so that the output may be directly outputted upwardly from the LD element.

The cover 9 has an outer appearance along on the shape of the cover bonding section 1e of a periphery region of the upper surface of the first base 1 in a plan view and has a shape having a space that covers the electronic component 6 mounted on the mounting section 1c of the upper surface of the first base 1. A window that transmits light may be provided in a portion that faces the electronic component 6, or an optical fiber and an optical isolator for optical feedback prevention may be bonded instead of the window or in addition to the window.

The cover 9 is made of a metal such as an Fe—Ni—Co alloy, an Fe—Ni alloy or an Fe—Mn alloy, and is manufactured by performing a known metal processing method such as pressing or punching for the metal plate material. It is preferable that the cover 9 has approximately the thermal expansion coefficient as that of the material of the first base 1, and it is more preferable that the cover 9 is made of the same material as the material of the first base 1. In a case where the cover 9 has the window, a hole is formed in the portion that faces the electronic component 6, and then a glass window member of a flat plate shape or a lens shape is bonded thereto by low melting point glass or the like.

The bonding of the cover 9 to the cover bonding section 1e of the first base 1 is performed by welding such as seam welding or YAG laser welding, or by brazing and soldering such as brazing using a brazing material such as an Au—Sn brazing material.

REFERENCE SIGNS LIST

1: First base
1a: First metal member
1b: Second metal member
1c: Mounting section
1d: First through-hole
1e: Cover bonding section
1f: Concave portion
2: Second base
2b: Second through-hole
3: Sealing material
4: Bonding material
5: Signal terminal
6: Electronic component
6a: Circuit board
6b: Relay board
7: Bonding wire
8: DC terminal
9: Cover
10: Groove
11: Temperature control element
12: PD element
13: Reflecting mirror
14: Temperature monitor element
15: Electronic component mounting package

The invention claimed is:

1. An electronic component mounting package, comprising:
    a first base comprising:
        an upper surface comprising a mounting section on which an electronic component is mounted;
        a lower surface opposed to the upper surface; and
        a first through-hole that is vertically formed;
    a second base bonded to a periphery of the lower surface, the second base comprising a second through-hole that is vertically formed and is overlapped with the first through-hole in a plan view;
    a sealing material that fills the second through-hole; and
    a signal terminal fixed to the second base to pass through the sealing material, the signal terminal passing through the first through-hole, and the signal terminal comprising an upper end portion protruding upwardly from the upper surface of the first base,
    the first base comprising a plurality of first metal members and a second metal member, the second metal member being vertically interposed between the plurality of first metal members, and
    a thermal expansion coefficient of the first metal members being larger than a thermal expansion coefficient of the second base, and a thermal conductivity of the second metal member being higher than a thermal conductivity of the first metal members.

2. The electronic component mounting package according to claim 1,
    wherein the thermal conductivity of the plurality of first metal members is higher than a thermal conductivity of the second base.

3. The electronic component mounting package according to claim 1,
    wherein an edge portion of the second metal member is exposed from the first metal members on a side surface of the first base.

4. The electronic component mounting package according to claim 1,
    wherein an outer size of the first base is larger than an outer size of the second base.

5. The electronic component mounting package according to claim 1,
wherein at least one of the first base and the second base comprises a groove along a bonding section of the first base and the second base.

6. The electronic component mounting package according to claim 1,
wherein the first base comprises a concave portion on the lower surface thereof, and the second base is bonded to the first base inside the concave portion.

7. The electronic component mounting package according to claim 1, further comprising a bonding material having a thermal conductivity higher than that of the plurality of first metal members, wherein
the bonding material is coated from a portion of the lower surface of the first base, which is opposite to the mounting section, to a periphery thereof, and wherein
the second base is bonded to the first base by the bonding material on the periphery.

8. An electronic apparatus, comprising:
the electronic component mounting package according to claim 1;
an electronic component mounted on the mounting section of the electronic component mounting package; and
a cover that is bonded to an upper surface of the first base and covers the electronic component and the first through-hole.

9. The electronic apparatus according to claim 8,
wherein a temperature control element is provided between the electronic component and the mounting section.

10. An electronic component mounting package, comprising:
a first layer comprising:
a first surface; and
a second surface opposed to the first surface;
a second layer comprising:
a third surface; and
a fourth surface opposed to the third surface;
a third layer sandwiched between the second surface and the third surface,
the first layer, the second layer and the third layer comprise a metal;
a first through-hole extending from the first surface to the fourth surface;
a fourth layer bonded to a periphery of the fourth surface,
a second through-hole extending from an upper surface thereof to a lower surface thereof, the second through-hole overlapped with the first through-hole in a plan view;
a sealing material filled in the second through-hole; and
a signal terminal fixed to an inside of the second through-hole with the sealing material, the signal terminal passing through the first through-hole, and the signal terminal comprising an upper end portion protruding upwardly from the first surface,
wherein a thermal expansion coefficient of the first layer and the second layer is larger than a thermal expansion coefficient of the fourth layer, and
wherein a thermal conductivity of the third layer is higher than a thermal conductivity of the first layer and the second layer.

* * * * *